(12) United States Patent  
Hanta (10) Patent No.: US 12,098,935 B2
(45) Date of Patent: Sep. 24, 2024

(54) DETECTOR (71) Applicant: KABUSHIKI KAISHA TOKAI RIKA DENKI SEISAKUSHO, Aichi (JP)

(72) Inventor: Yoshiki Hanta, Aichi (JP)

(73) Assignee: KABUSHIKI KAISHA TOKAI RIKA DENKI SEISAKUSHO, Aichi (JP)

( * ) Notice: Subject to any disclaimer, the term of this patent is extended or adjusted under 35 U.S.C. 154(b) by 59 days.

(21) Appl. No.: 17/895,438

(22) Filed: Aug. 25, 2022

(65) Prior Publication Data

US 2023/0073995 A1 Mar. 9, 2023

(30) Foreign Application Priority Data

Sep. 3, 2021 (JP) ................. 2021-144028

(51) Int. Cl.
*G01D 5/24* (2006.01)
*H03K 17/955* (2006.01)
*H03K 17/96* (2006.01)

(52) U.S. Cl.
CPC ............. *G01D 5/24* (2013.01); *H03K 17/955* (2013.01); *H03K 17/962* (2013.01); *H03K 2217/96015* (2013.01)

(58) Field of Classification Search
CPC ........ H03K 2217/96015; H03K 2217/960705; H03K 17/96; H03K 17/955; H03K 17/962; H03K 17/127; H03K 17/08148; H03K 17/975; G06F 3/03547; G06F 3/0445; G06F 3/0488; G06F 2203/04101; G06F 3/011; G06F 3/044; G06F 3/0447; G06F 3/0414; G06F 11/3438; G06F 1/3231; G06F 11/3485; G01R 15/16; G01R 19/165; G01R 31/3842; G01D 5/145; G01D 5/24

See application file for complete search history.

(56) References Cited

U.S. PATENT DOCUMENTS 5,777,604 A * 7/1998 Okajima ................. G06F 3/045
345/173
10,031,633 B2 * 7/2018 Ichikawa ................ G06F 3/045
(Continued)

FOREIGN PATENT DOCUMENTS

JP 2018-37348 A 3/2018

*Primary Examiner* — Vinh P Nguyen
(74) *Attorney, Agent, or Firm* — GREENBLUM & BERNSTEIN, P.L.C.

(57) ABSTRACT

A detector applies voltage to a first electrode and a second electrode facing the first electrode to detect a user operation performed on the operation surface based on a change in capacitance of the first electrode to which voltage has been applied. The detector includes a switch unit that forcibly switches the second electrode to a state connected to ground so that the second electrode shifts to ground potential after voltage is applied to the first electrode when a change in the capacitance of the first electrode is being detected. A determination unit determines whether wire breakage is occurring in the first electrode and the second electrode based on a detection signal obtained from the first electrode after the first electrode is connected to ground and a difference in the detection signal obtained from the first electrode before and after the first electrode is connected to ground.

7 Claims, 6 Drawing Sheets (56) References Cited

U.S. PATENT DOCUMENTS

| | | | | |
|---|---|---|---|---|
| 10,146,370 B2* | 12/2018 | Mori | ................ | G06F 3/04182 |
| 10,158,360 B2* | 12/2018 | Kao | ................ | H03K 17/962 |
| 11,456,740 B2* | 9/2022 | Wu | ................ | H03K 17/962 |
| 11,863,174 B2* | 1/2024 | Wu | ................ | H03K 17/962 |

* cited by examiner

ΔC=Cn2−Cn1=Large

DETECTOR

BACKGROUND

1. Field

The present disclosure relates to a detector that detects a user operation from a change in capacitance of an electrode.

2. Description of Related Art

A capacitance-type operation detector is known in the art (Japanese Laid-Open Patent Publication No. 2018-037348). Such type of an operation detector includes a sensor electrode and a cancel electrode. The cancel electrode decreases the capacitance between the sensor electrode and a reference point. The operation detector includes a controller that applies a drive signal to the sensor electrode and applies a signal having the same waveform as the drive signal to the cancel electrode to detect a user operation from a change in capacitance of the sensor electrode.

The wire connecting the controller to the sensor electrode differs from the wire connecting the controller to the cancel electrode. Thus, when any one of the wires breaks, a user operation cannot be detected with the sensor electrode.

SUMMARY

A detector applies voltage to a first electrode that detects when a human body approaches or contacts an operation surface and a second electrode that is arranged facing the first electrode to detect a user operation performed on the operation surface based on a change in capacitance of the first electrode to which voltage has been applied. The detector includes a switch unit and a determination unit. The switch unit forcibly switches the second electrode to a state connected to ground so that the second electrode shifts to ground potential after voltage is applied to the first electrode when a change in the capacitance of the first electrode is being detected. The determination unit determines whether wire breakage is occurring in the first electrode and whether wire breakage is occurring in the second electrode based on a value of a detection signal obtained from the first electrode after the first electrode is connected to ground and a difference in the detection signal obtained from the first electrode before and after the first electrode is connected to ground.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

This description provides a comprehensive understanding of the methods, apparatuses, and/or systems described. Modifications and equivalents of the methods, apparatuses, and/or systems described are apparent to one of ordinary skill in the art. Sequences of operations are exemplary, and may be changed as apparent to one of ordinary skill in the art, with the exception of operations necessarily occurring in a certain order. Descriptions of functions and constructions that are well known to one of ordinary skill in the art may be omitted.

Exemplary embodiments may have different forms, and are not limited to the examples described. However, the examples described are thorough and complete, and convey the full scope of the disclosure to one of ordinary skill in the art.

One embodiment of the present disclosure will now be described.

Entire Configuration of Present Disclosure

Figure 1:
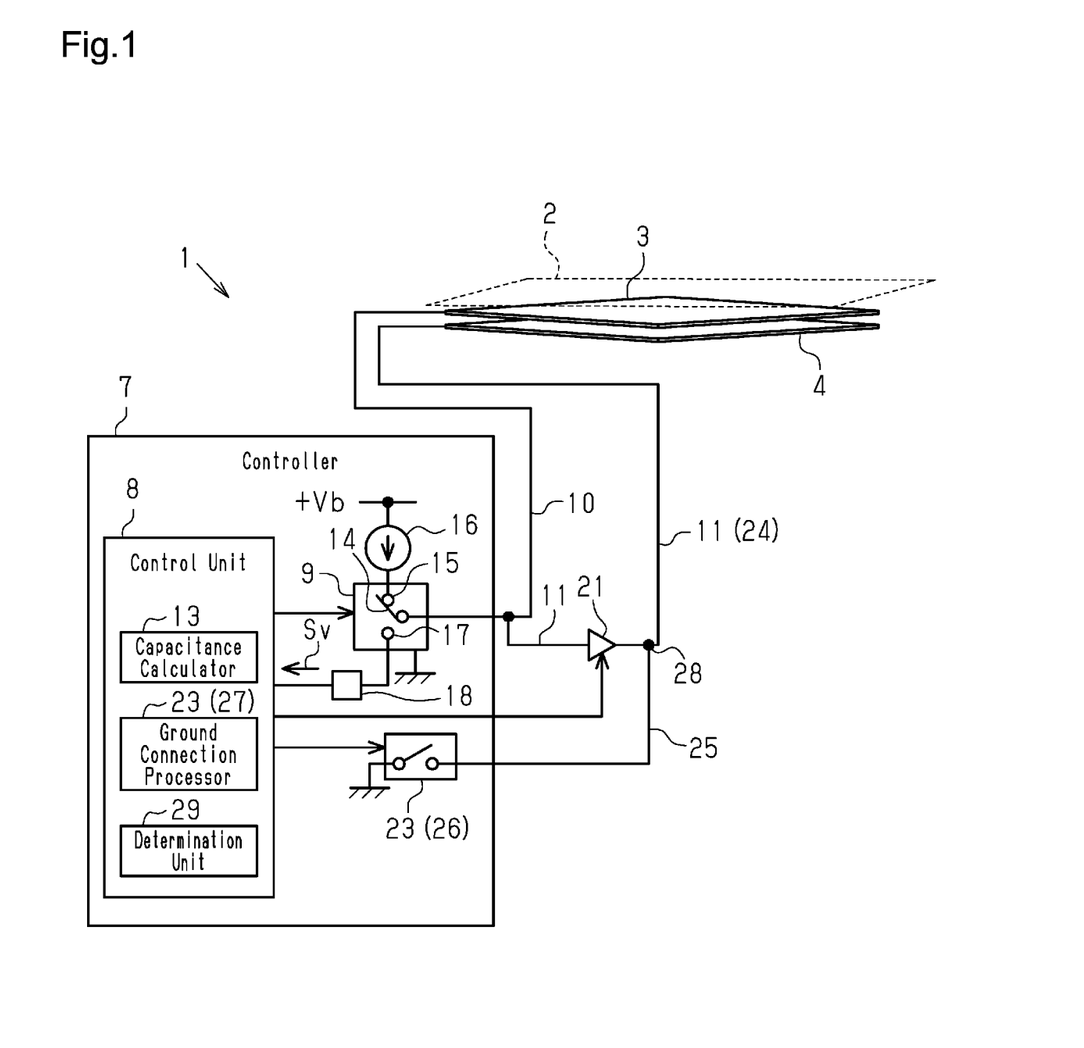
FIG. 1 is a schematic diagram illustrating one embodiment of a detector.

Referring to FIG. 1, a detector 1 detects when a human body (user) contacts or approaches an operation surface 2. When installed in a vehicle, the detector 1 is arranged on a rim of a steering wheel (not shown). Preferably, in this case, the detector 1 detects whether the user is touching (gripping) the rim of the steering wheel. The operation surface 2 may be, for example, any one of a curved surface and a flat surface.

The detector 1 includes a first electrode 3 that detects when a human body contacts or approaches the operation surface 2 and a second electrode 4 arranged facing the first electrode 3. The first electrode 3 is a sensor electrode that detects a user operation. The second electrode 4 is a shield electrode that electrically shields the first electrode 3. The detector 1 applies voltage to the first electrode 3 and the second electrode 4 and detects a user operation performed on the operation surface 2 based on a change in the capacitance of the first electrode 3. In this manner, the detector 1 is of a capacitance (self-capacitance) type and detects a user operation from a change in the capacitance of the first electrode 3.

The first electrode 3 are the second electrode 4 each have the form of a sheet. The first electrode 3 and the second electrode 4 are arranged one over the other with an insulative (dielectric) sheet located in between. Thus, the first electrode 3 and the second electrode 4 form layers of sheets. The opposing surfaces of the first electrode 3 and the second electrode 4 have the same area. Alternatively, the opposing surface of the second electrode 4 is larger (wider) than that of the first electrode 3. Thus, the second electrode 4 covers the first electrode 3. As a result, a human body contacting or approaching the surface of the first electrode 3 at the side opposite to the second electrode 4 induces and changes the capacitance of the first electrode 3.

The detector 1 includes a controller 7 that controls actuation of the detector 1. The controller 7 includes a control unit 8 that actuates the controller 7 and a first switch 9 arranged between the control unit 8 and the group of electrodes, namely, the first electrode 3 and the second electrode 4. The control unit 8 is, for example, a microcomputer. The controller 7 is connected to the first electrode 3 by a first wire 10 and connected to the second electrode 4 by a second wire 11 branched from the first wire 10.

The control unit 8 includes a capacitance calculator 13 that obtains the capacitance of the first electrode 3 and executes an operation determination process. The operation determination process detects a user operation (contact or approach of human body) performed on the operation surface 2 from a change in the capacitance of the first electrode 3. The capacitance calculator 13 executes the operation determination process by having the first switch 9 alternately switch between a state charging the first electrode 3 and a state receiving capacitance data from the first electrode 3. In this manner, the capacitance calculator 13 detects a user operation performed on the operation surface 2 by repeating the operation determination process that applies voltage to the first electrode 3 and monitors changes in the capacitance of the first electrode 3.

The first switch 9 includes a movable first contact 14, a fixed second contact 15, and another fixed third contact 17. The movable first contact 14 is connected to the first electrode 3, the fixed second contact 15 is connected to a constant current source 16, and the other fixed third contact 17 is connected by an A/D converter 18 to the control unit 8. In the first switch 9, the second contact 15 serves as a power feeding terminal and the third contact 17 serves as a detecting terminal. The first contact 14 of the first switch 9 is connected by the first wire 10 to the first electrode 3. When the first contact 14 of the first switch 9 is connected to the second contact 15, the constant current source 16 is connected to the first electrode 3. Thus, the first electrode 3 is charged by the constant current source 16. The first electrode 3 is charged by the constant current source 16 to generate voltage that is in accordance with the capacitance.

When the first contact 14 of the first switch 9 is connected to the third contact 17, the first electrode 3 is connected by the A/D converter 18 to the control unit 8. This results in the first electrode 3 sending a detection signal Sv that corresponds to the capacitance of the first electrode 3 to the control unit 8. In the present example, the constant current source 16 functions to keep the electric charge stored in the first electrode 3 constant, and the detection signal Sv has a voltage level corresponding to the capacitance of the first electrode 3.

The capacitance calculator 13 obtains the detection signal Sv from the first electrode 3 by repeating a main cycle (main loop) in which a process connecting the first switch 9 to the constant current source 16 and a process connecting the first switch 9 to the control unit 8 in each main cycle (main loop) are sequentially performed. In this manner, the capacitance calculator 13 checks changes in the detection signal Sv that is intermittently received from the first electrode 3 to determine whether a user operation is being performed on the operation surface 2, that is, to detect a touch operation.

The detector 1 includes a buffer 21 that sets a potential at the second electrode 4 to be the same as that at the first electrode 3. The buffer 21 is, for example, an operational amplifier. Preferably, the operational amplifier is a voltage follower provided with a shutdown functionality. The buffer 21 is connected to the second wire 11 that branches from the first wire 10 and connects to the second electrode 4. Thus, the input side of the buffer 21 is connected to the first wire 10, and the output side of the buffer 21 is connected to the second electrode 4. The buffer 21 is actuated by electric power from the control unit 8. Preferably, the output side of the buffer 21 has high impedance.

Overview of Wire Breakage Detection Functionality

The detector 1 is provided with a functionality for detecting wire breakage in the electrode wiring (wire breakage detection functionality). Preferably, a wire breakage detection process is, for example, independent from the operation determination process and executed cyclically. More specifically, the wire breakage detection process is one of the processes executed in the main cycle by the control unit 8 and repeated in cycles as a set with the operation determination process. The wire breakage detection process detects wire breakage in both of the first wire 10, which extends from the first electrode 3, and the second wire 11 (i.e., connection wire 24, described later), which extends from the second electrode 4.

The detector 1 includes a switch unit 23 that forcibly switches the second electrode 4 to a state connected to ground so that the second electrode 4 shifts to a ground potential when the wire breakage detection process is executed. Preferably, the switch unit 23 forcibly switches the second electrode 4 to a state connected to ground so that the second electrode 4 shifts to a ground potential when a change in the capacitance of the first electrode 3 is being detected after voltage is applied to the first electrode 3. The switch unit 23 connects to ground a branching wire 25 branched from the connection wire 24 connecting the second electrode 4 and the buffer 21 to forcibly shift the second electrode 4 to ground voltage. The connection wire 24 is part of the second wire 11.

The switch unit 23 includes a second switch 26 and a ground connection processor 27. The second switch 26 connects and disconnects the second electrode 4 to and from ground. The ground connection processor 27 switches the connection state of the second switch 26. The second switch 26 is arranged in, for example, the controller 7. The ground connection processor 27 is arranged in, for example, the control unit 8.

One terminal of the second switch 26 is connected by the connection wire 24 to the output side of the buffer 21, and the other terminal of the second switch 26 is connected to ground. The ground connection processor 27 switches the switching state of the second switch 26 in order to set node 28, which is located between the second electrode 4 and the output side of the buffer 21, to a state connected to ground so that the impedance becomes low and a state disconnected from ground so that the impedance become high.

The control unit 8 includes a determination unit 29 that determines whether wire breakage has occurred in the first electrode 3 and the second electrode 4 when the switch unit 23 connects the second electrode 4 to ground. The determination unit 29 is arranged in, for example, the control unit 8. The determination unit 29 determines whether wire breakage has occurred at the first electrode 3 and whether wire breakage has occurred at the second electrode 4 based on a value of the detection signal Sv obtained from the first electrode 3 after the second electrode 4 is connected to ground and a difference ΔC in the detection signal Sv obtained from the first electrode 3 before and after the second electrode 4 is connected to ground. In the present example, the determination unit 29 determines the occurrence of a wire breakage based on the digital detection signal Sv received from the A/D converter 18.

The operation of the detector 1 will now be described.

Referring to FIG. 1, in the operation determination process, the capacitance calculator 13 connects the first contact 14 of the first switch 9 to the second contact 15, which is the power feeding side, and charges the first electrode 3. Here, the capacitance calculator 13 actuates the buffer 21 so that the potential at the second electrode 4 becomes the same as that at the first electrode 3. Further, the ground connection processor 27 turns off the second switch 26 so that the second electrode 4 is not connected to ground.

Figure 2:
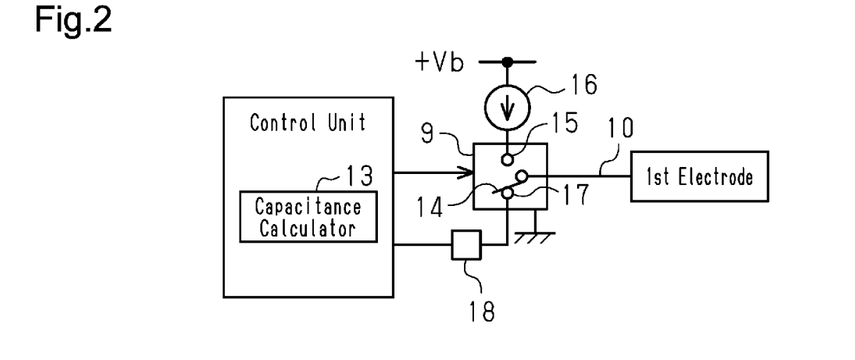
FIG. 2 is a diagram illustrating an action of a first switch.

Referring to FIG. 2, after the first electrode 3 is charged for a specified period of time, the capacitance calculator 13 connects the first contact 14 of the first switch 9 to the third contact 17, which is the detecting side. As a result, the detection signal Sv, which corresponds to the voltage (capacitance) at the first electrode 3 is input via the A/D converter 18 to the control unit 8. Accordingly, the capacitance calculator 13 obtains the detection signal Sv, which is based on the capacitance detected at the first electrode 3. The detection signal Sv is, for example, capacitance data of the first electrode 3. Preferably, when the detection signal Sv is obtained from the A/D converter 18, the capacitance calculator 13 discharges the first electrode 3. When the detection signal Sv is obtained from the A/D converter 18, the capacitance calculator 13 uses the detection signal Sv to execute touch determination.

Figure 3:
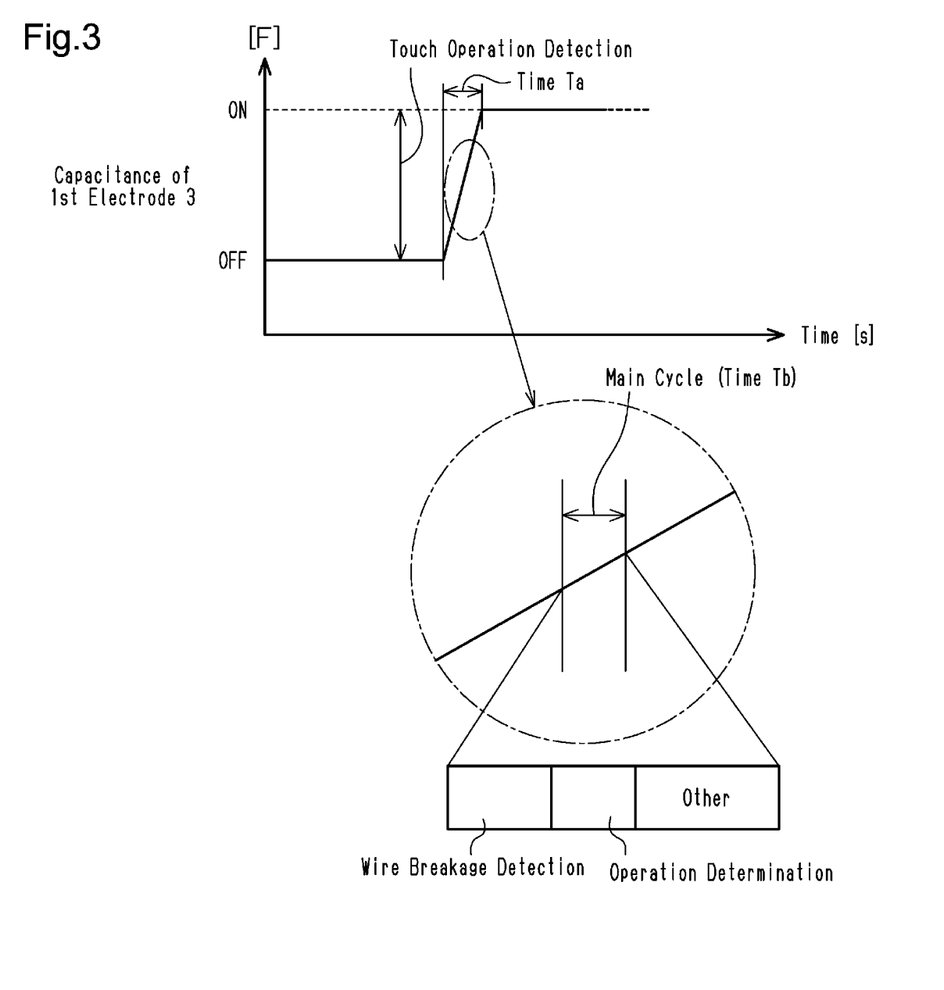
FIG. 3 is a waveform chart illustrating a change in capacitance of a first electrode when a touch operation is performed.

As shown in FIG. 3, the capacitance calculator 13 repeats the operation determination process in each main cycle (main loop) that is set in advance for the control unit 8. The main cycle is set to be performed over a time ("Tb") that is shorter than the time ("Ta") required for the capacitance to change so that a user operation can be detected. The processing time in the main cycle is set to be shorter than the time required for the capacitance to change so that a touch operation can be detected. The operation determination process, which is one of the processes executed during the main cycle, is also set to be shorter than the time required for the capacitance to change so that a user operation can be detected.

The wire breakage detection process is also executed during each main cycle. In this example, a set of the wire breakage detection process and the operation determination process is repeated. Thus, in a single main cycle, the wire breakage detection process and the operation determination process are each executed once. In the example of FIG. 3, the wire breakage detection process is executed before the operation determination process. However, this order may be reversed. Further, the main cycle may include processes other than the wire breakage detection process and the operation determination process.

Figure 4A:
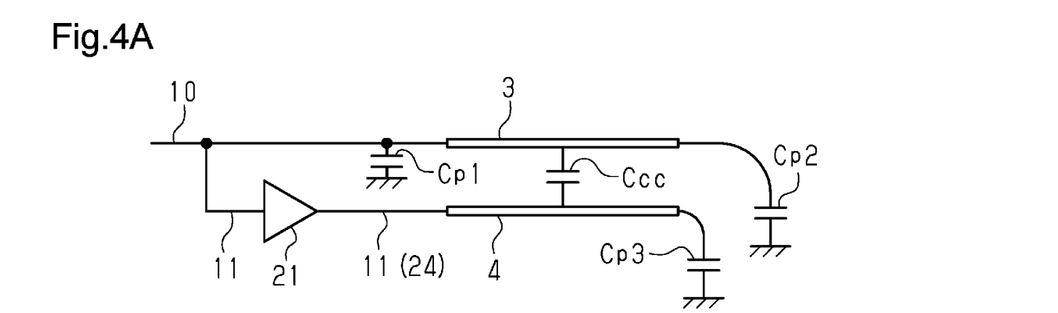
FIG. 4A is a diagram illustrating the capacitance of an electrode group when an operation is not performed.
Figure 4B:
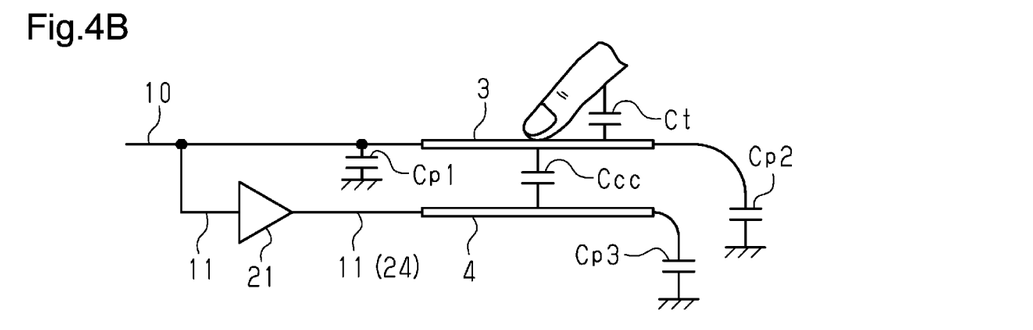
FIG. 4B is a diagram illustrating the capacitance of the electrode group when an operation is performed.

As shown in FIGS. 4A and 4B, in the capacitance type detector 1, a first parasitic capacitance Cp1 exists in the first wire 10, a second parasitic capacitance Cp2 exists between the first electrode 3 and ground, and a third parasitic capacitance Cp3 exists between the second electrode 4 and ground. Further, an inter-electrode capacitance Ccc exists between the first electrode 3 and the second electrode 4. The second electrode 4 faces the entire surface of the first electrode 3. The second electrode 4 is arranged between the first electrode 3 and ground to have the functionality of a shield.

In the operation determination process, the buffer 21 is actuated and the second switch 26 is turned off. Thus, the first switch 9 of the controller 7 is connected to the first electrode 3. The first switch 9 is also connected via the buffer 21 to the second electrode 4. In this state, if the first contact 14 of the first switch 9 is connected to the power feeding side second contact 15, the potential at the first electrode 3 becomes the same (or substantially the same) as the potential at the second electrode 4 because of the buffer 21. Thus, the inter-electrode capacitance Ccc between the first electrode 3 and the second electrode 4 is substantially zero. Further, the second electrode 4 decreases the second parasitic capacitance Cp2 of the first electrode 3.

As shown in FIG. 4A, when the human body of the user is neither contacting nor approaching the operation surface 2 (first electrode 3), the capacitance at the first electrode 3 is less than the combined capacitance of the first parasitic capacitance Cp1 and the second parasitic capacitance Cp2.

As shown in FIG. 4B, when the human body of the user is contacting or approaching the operation surface 2 (first electrode 3), the capacitance at the first electrode 3 becomes equal to a combined capacitance of the capacitance when the human body of the user is neither contacting nor approaching the operation surface 2 and a capacitance Ct that becomes present between the first electrode 3 and the human body of the user. In this manner, when a human body is contacting or approaching the operation surface 2, the capacitance at the first electrode 3 is greater than the capacitance when the human body of the user is neither contacting nor approaching the operation surface 2.

The capacitance calculator 13 charges the first electrode 3 and then connects the first contact 14 of the first switch 9 to the detecting side third contact 17 and receives the detection signal Sv, which is based on a change in the capacitance of the first electrode 3, from the first electrode 3 via the A/D converter 18. In the present example, the output side of the buffer 21 has high impedance. Thus, the electric charge stored in the second electrode 4 does not affect the detection signal Sv.

After data of the detection signal Sv is obtained, the capacitance calculator 13 executes touch operation determination with the detection signal Sv. The capacitance calculator 13 determines that a touch operation (contact or approach of human body) is being performed when the detection signal Sv changes greatly. The capacitance calculator 13 determines that a touch operation (contact or approach of human body) is not being performed when the detection signal Sv does not change. The capacitance calculator 13 repeats the electrode charging, the acquisition of the detection signal Sv, and the touch operation determination to detect a human body contacting or approaching the operation surface 2.

Figure 5A:
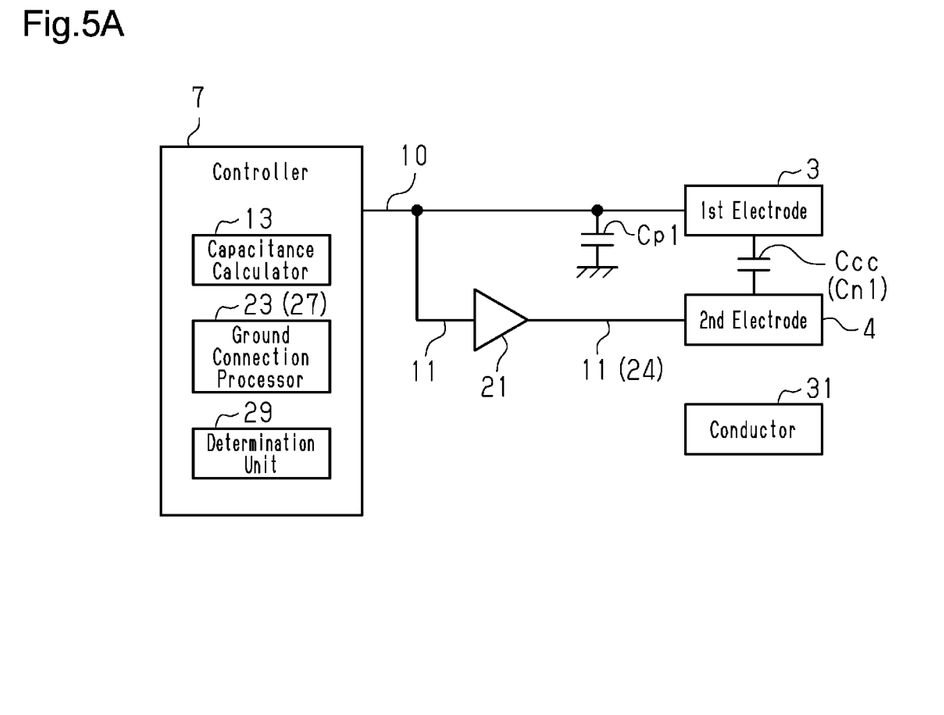
FIG. 5A is a diagram illustrating a state in which there is no wire breakage in the first electrode and the second electrode.
Figure 5B:
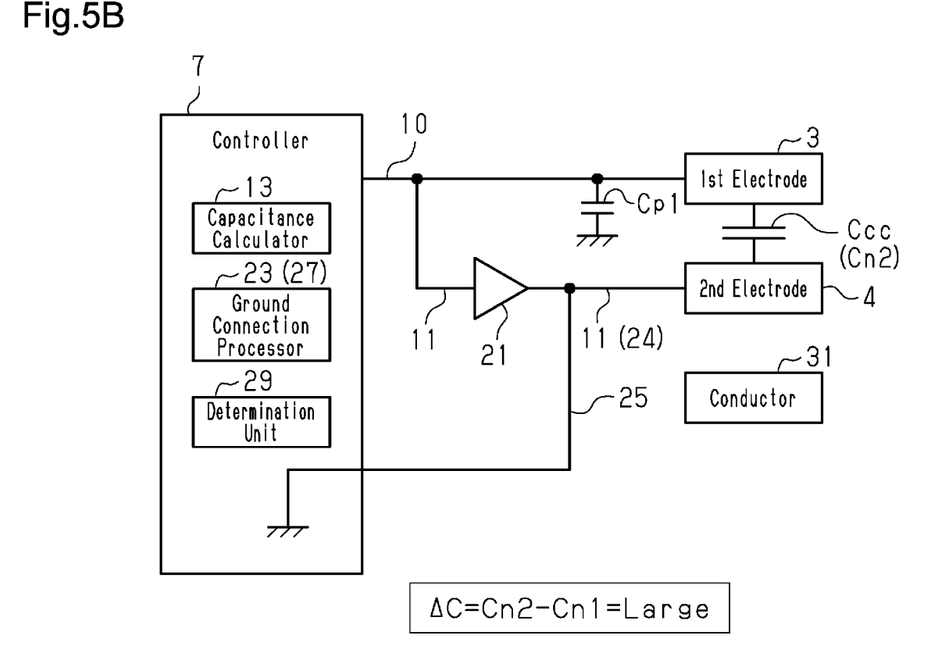
FIG. 5B is a diagram illustrating a state in which the second electrode shifts to ground potential when there is no wire breakage.

Referring to FIGS. 5A and 5B, the controller 7 executes the wire breakage detection process at a time that differs from when the operation determination process is executed. Preferably, the wire breakage detection process is performed instantaneously by readily switching the connection state of the second switch 26 during the detection of a touch operation. A process for connecting the first switch 9 from the power feeding side to the detecting side is also performed during the wire breakage detection process. The wire breakage detection process may be executed in cycles together with the operation determination process or executed only once for every certain number of operation determination processes. The wire breakage detection process does not have to be performed regularly and may be performed irregularly. In this manner, there is no limitation to when the wire breakage detection process is executed.

As shown in FIG. 5A, the inter-electrode capacitance Ccc prior to execution of the wire breakage detection process, that is, the inter-electrode capacitance Ccc during the operation determination process, has a small value of "Cn1" because of the shield functionality of the second electrode 4. Thus, even if a conductor 31 is located near the first electrode 3 and the second electrode 4, the inter-electrode capacitance Ccc will be subtly affected by the conductor 31.

As shown in FIG. 5B, when the wire breakage detection process is performed, the ground connection processor 27 de-actuates the buffer 21 and turns on the second switch 26 to connect the second electrode 4 to ground. In this state, the second electrode 4 is electrically disconnected from the first electrode 3 and connected to ground. When the second electrode 4 is connected to ground, the inter-electrode capacitance Ccc between the first electrode 3 and the second electrode 4 has a large value of "Cn2" with respect to the second parasitic capacitance Cp2 and the third parasitic capacitance Cp3.

After the second electrode 4 is connected to ground in the wire breakage detection process, the determination unit 29 checks the value of the first electrode 3 to determine whether wire breakage is occurring in the first electrode 3. In the present example, wire breakage of the first wire 10 is detected as wire breakage in the first electrode 3. When the second electrode 4 is connected to ground, the determination unit 29 determines whether wire breakage is occurring in the first electrode 3 based on the detection signal Sv received from the first electrode 3 via the first switch 9 and the A/D converter 18.

If wire breakage is not occurring in the first electrode 3 when the second electrode 4 is connected to ground in the wire breakage detection process, the inter-electrode capacitance Ccc will change from "Cn1" to "Cn2," and the voltage level of the detection signal Sv will become low. Thus, if the detection signal Sv of the first electrode 3 changes greatly, or becomes less than a first electrode wire breakage determination threshold value, when the second electrode 4 is connected to ground in the wire breakage detection process, the determination unit 29 determines that wire breakage is not occurring at the first electrode 3.

After the second electrode 4 is connected to ground in the wire breakage detection process, the determination unit 29 checks the difference ΔC of the first electrode 3 before and after the connection to ground to determine whether a wire breakage is occurring in the second electrode 4. In the present example, wire breakage of the second wire 11 (specifically, connection wire 24) is detected as wire breakage in the second electrode 4. When the second electrode 4 is connected to ground, the determination unit 29 determines whether wire breakage is occurring in the second electrode 4 based on the detection signal Sv received from the first electrode 3 via the first switch 9 and the A/D converter 18.

If wire breakage is not occurring in the second electrode 4 when the second electrode 4 is connected to ground in the wire breakage detection process, the inter-electrode capacitance Ccc will change from "Cn1" to "Cn2" and the difference ΔC in capacitance of the first electrode 3 before and after the connection to ground will increase. Thus, if the voltage difference of the detection signal Sv of the first electrode 3 before and after the connection to ground changes greatly, or become greater than or equal to a second electrode wire breakage determination threshold value, when the second electrode 4 is connected to ground in the wire breakage detection process, the determination unit 29 will determine that wire breakage is not occurring at the second electrode 4.

Figure 6A:
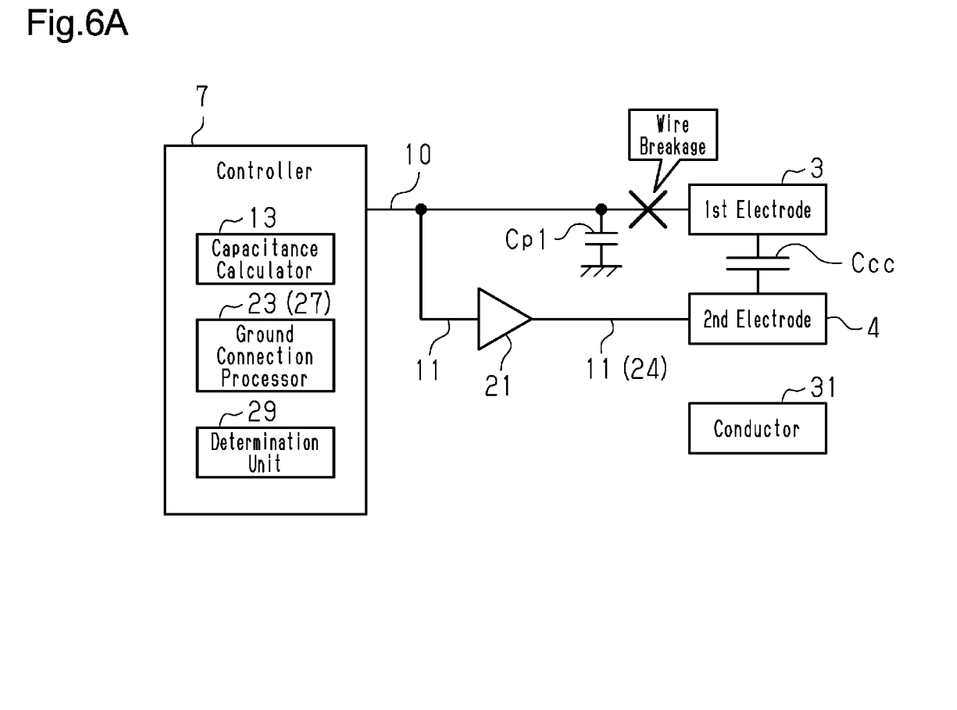
FIG. 6A is a diagram illustrating a state in which wire breakage occurs in the first electrode.

FIG. 6A is a diagram illustrating a state in which wire breakage is occurring in the first electrode 3 (first wire 10). As shown in FIG. 6A, when wire breakage occurs in the first electrode 3, the first electrode 3 is disconnected from the controller 7. Thus, the detection signal Sv that the controller 7 receives from the A/D converter 18 is a value corresponding to only the first parasitic capacitance Cp1. More specifically, the detection signal Sv that the controller 7 receives from the A/D converter 18 has a high voltage value.

Figure 6B:
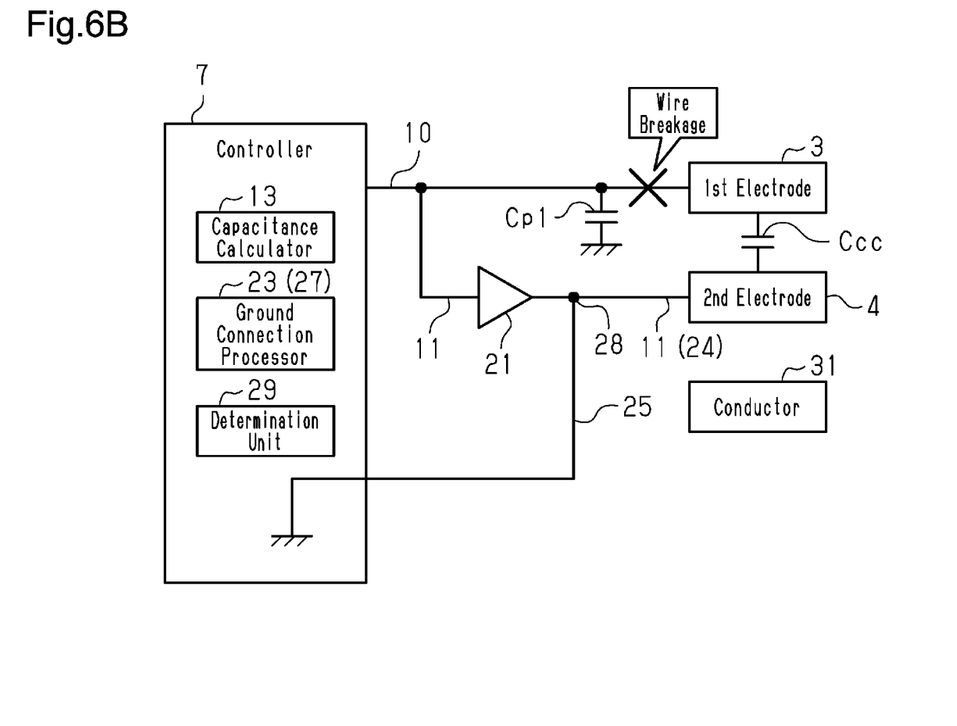
FIG. 6B is a diagram illustrating a state in which the second electrode shifts to a ground potential when wire breakage occurs in the first electrode.

As shown in FIG. 6B, if wire breakage occurs at the first electrode 3 when the second electrode 4 is connected to ground in the wire breakage detection process, the detection signal Sv that the controller 7 receives from the A/D converter 18 will remain unchanged and continue to have a voltage corresponding to the first parasitic capacitance Cp1. That is, the voltage level of the detection signal Sv will continue to be high. Thus, if the detection signal Sv of the first electrode 3 does not change greatly, or become greater than or equal to the first electrode wire breakage determination threshold value, when the second electrode 4 is connected to ground in the wire breakage detection process, the determination unit 29 will determine that wire breakage is occurring at the first electrode 3.

Figure 7A:
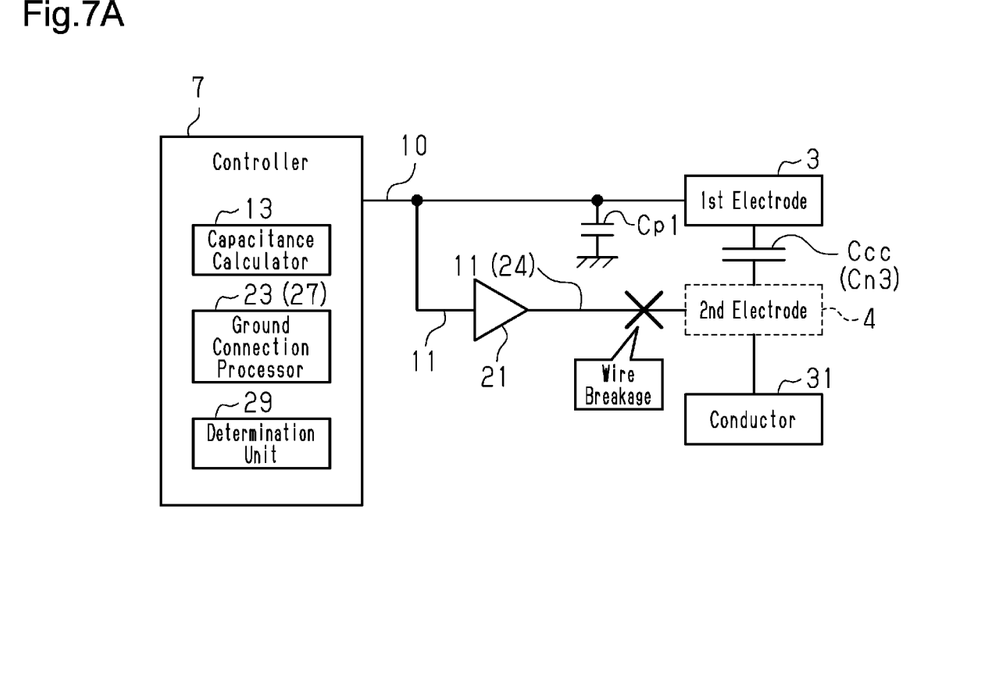
FIG. 7A is a diagram illustrating a state in which wire breakage occurs in the second electrode.

FIG. 7A is a diagram illustrating a state in which wire breakage is occurring at the second electrode 4 (connection wire 24). As shown in FIG. 7A, when wire breakage occurs at the second electrode 4, the second electrode 4 becomes inactive and the shield functionality is lost. Thus, the conductor 31 affects the first electrode 3. In this example, prior to the execution of the wire breakage detection process, the inter-electrode capacitance Ccc has a large value of "Cn3." Thus, the detection signal Sv that the controller 7 receives from the A/D converter 18 has a low voltage value.

Figure 7B:
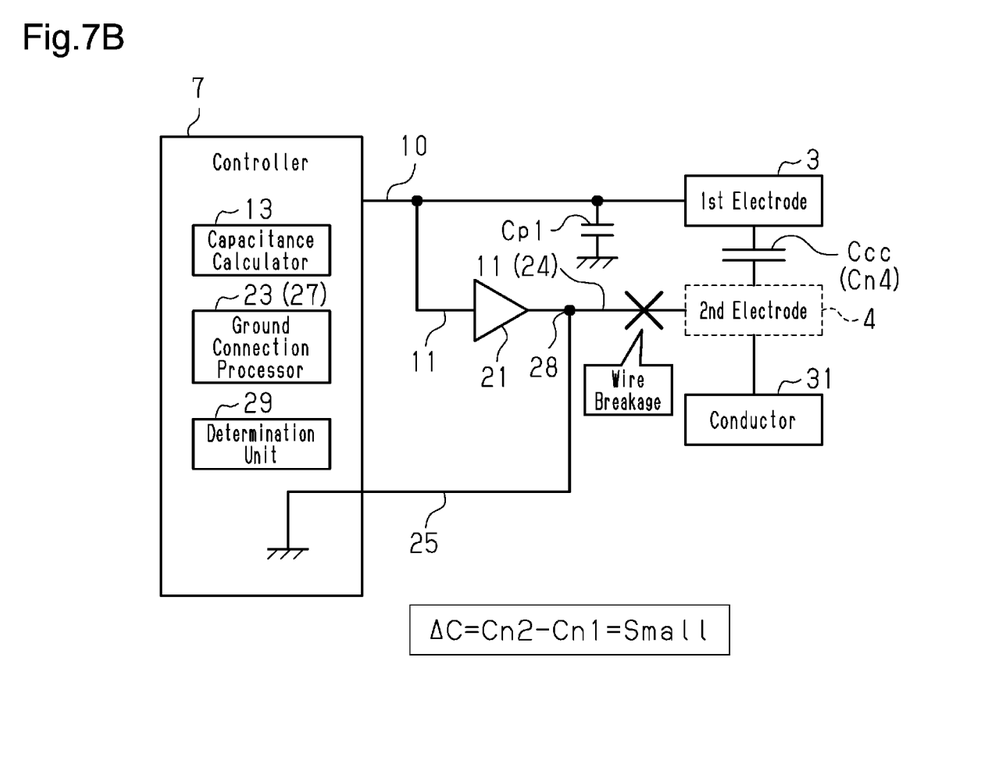
FIG. 7B is a diagram illustrating a state in which the second electrode shifts to a ground potential when wire breakage occurs in the second electrode.

As shown in FIG. 7B, if wire breakage occurs at the second electrode 4 when the second electrode 4 is connected to ground in the wire breakage detection process, the second electrode 4 will not function and the first electrode 3 will continuously be affected by the conductor 31. In this example, the inter-electrode capacitance Ccc after the second electrode 4 is connected to ground in the wire breakage detection process has a large value of "Cn4."

Thus, even if the second electrode 4 is connected to ground in the wire breakage detection process, the detection signal Sv that the controller 7 receives from the A/D converter 18 remains unchanged and has a voltage corresponding to the inter-electrode capacitance Ccc, which has a large value, and continues to have a low voltage level. Consequently, if the voltage difference of the detection signal Sv before and after the connection to ground is small, or less than the second electrode wire breakage determination threshold value, when the second electrode 4 is connected to ground in the wire breakage detection process, the determination unit 29 determines that wire breakage has occurred in the second electrode 4.

When there is no wire breakage in both of the first electrode 3 and the second electrode 4, the capacitance calculator 13 continues the operation determination process. When wire breakage occurs in at least one of the first electrode 3 and the second electrode 4, the capacitance calculator 13 interrupts or stops the operation determination process. Thus, under a situation in which wire breakage occurs in at least one of the first electrode 3 and the second electrode 4, user operation will not be detected. This improves the operation determination accuracy.

The detector 1 of the above embodiment has the advantages described below.

(1) The detector 1 applies voltage to the first electrode 3, which detects when a human body approaches or contacts the operation surface 2, and the second electrode 4, which is arranged facing the first electrode 3, to detect a user operation performed on the operation surface 2 from a change in the capacitance of the first electrode 3. When detecting a change in the capacitance of the first electrode 3 after applying voltage to the first electrode 3, the switch unit 23 of the detector 1 forcibly switches the second electrode 4 to a state connected to ground and shifts the second electrode 4 to ground potential. The determination unit 29 of the detector 1 determines whether wire breakage is occurring in the first electrode 3 and whether wire breakage is occurring in the second electrode 4 based on the detection signal Sv obtained from the first electrode 3 after the first electrode 3 is connected to ground and the difference ΔC in the detection signal Sv obtained from the first electrode before and after the first electrode 3 is connected to ground.

The configuration of the present example determines that wire breakage is occurring in the first electrode 3 if the detection signal Sv obtained from the first electrode 3 does not change greatly after the second electrode 4 is connected to ground. When the second electrode 4 is connected to ground, the occurrence of wire breakage in the second electrode 4 is determined if the difference ΔC is small in the detection signal Sv obtained from the first electrode 3 before and after the first electrode 3 is connected to ground. Thus, wire breakage can be detected in both of the first electrode 3 and the second electrode 4.

(2) The detector 1 includes the buffer 21 that sets the potential at the second electrode 4 to the same potential as that at the first electrode 3 when voltage is applied to the first electrode 3. This configuration allows the capacitance to be substantially zero between the first electrode 3 and the second electrode 4 and improves the accuracy for detecting user operation.

(3) The switch unit 23 connects the branching wire 25, which is branched from the connection wire 24 connecting the second electrode 4 and the buffer 21, to ground in order to forcibly shift the second electrode 4 to ground potential. This configuration directly connects the second electrode 4 to ground and lowers the second electrode 4 to ground voltage.

(4) The capacitance calculator 13 of the detector 1 repeats the operation determination process, which applies voltage to the first electrode 3 and monitors changes in the capacitance of the first electrode 3, to detect a user operation performed on the operation surface. The wire breakage detection process, which forcibly lowers the second electrode 4 to ground potential and determines wire breakage, is independent from the operation determination process. With this configuration, the operation determination process and the wire breakage detection process are independent from each other. This allows the operation determination process and the wire breakage detection process to be simple.

(5) The processing time of at least one of the operation determination process and the wire breakage detection process is shorter than the time required for the capacitance to change so that a user operation can be detected. Thus, a touch operation or a wire breakage can be instantaneously determined even when the user is performing a touch operation on the operation surface 2.

(6) A set of the wire breakage detection process and the operation determination process is repeated in cycles. This configuration regularly monitors whether a user operation is performed on the operation surface 2 and whether wire breakage is occurring in the first electrode 3 and the second electrode 4. Thus, a user operation and a wire breakage can be readily detected.

The present embodiment may be modified as described below. The present embodiment and the following modifications can be combined as long as there is no technical contradiction.

The wire breakage detection process does not have to simultaneously perform wire breakage determination of the first electrode 3 and wire breakage determination of the second electrode 4. For example, the wire breakage determination of the first electrode 3 and wire breakage determination of the second electrode 4 may be performed in an alternating manner each time the first electrode 3 is charged and the detection signal Sv is obtained from the first electrode 3.

The operation determination process may just obtain the detection signal Sv from the first electrode 3 subsequent to charging.

The buffer 21 may be omitted from the detector 1.

The detector 1 is not limited to use in a vehicle and may be used in other devices.

The capacitance calculator 13, the switch unit 23, and the determination unit 29 may each be implemented by 1) one or more processors that run on computer programs (software) or 2) a combination of such processors and one or more dedicated hardware circuits such as application-specific integrated circuits (ASICs) that execute at least some of various types of processes. The processors include a CPU and a memory such as a RAM and a ROM, and the memory stores program codes or instructions configured to have the CPU execute processes. The memory, namely, a computer readable medium, includes any available medium that is accessible by a versatile or dedicated computer. Instead of a computer including the above processors, processing circuitry including one or more dedicated hardware circuits may be used to execute the processes described above.

The capacitance calculator 13, the switch unit 23, and the determination unit 29 may each be implemented by an independent processor. Alternatively, a common processor may be configured to provide some of these functionalities. In this manner, the capacitance calculator 13, the switch unit 23, and the determination unit 29 do not have to be implemented in functional blocks and may be implemented by partially sharing a common functional block.

The present disclosure encompasses the embodiment described below.

Embodiment 1

A computer system, including:
one or more processors; and
a non-transitory memory storing instructions executable by the one or more processors,
wherein when executed by the one or more processors, the instructions have the processor:
apply voltage to a first electrode (3) that detects when a human body contacts or approaches an operation surface (2) and a second electrode (4) arranged facing the first electrode (3) at a side of the first electrode (3) opposite to the operating surface (2);
detect a user operation performed on the operating surface (2) based on a change in capacitance of the first electrode (3) to which voltage has been applied;
connect the second electrode (4) to ground to shift the second electrode (4) to ground potential while detecting a change in the capacitance of the first electrode (3) after applying voltage to the first electrode (3); and determine whether wire breakage is occurring in the first electrode (3) and whether wire breakage is occurring in the second electrode (4) based on a value of a detection signal obtained from the first electrode (3) after the second electrode (4) is connected to ground and a difference in the detection signal obtained from the first electrode (3) before and after the second electrode (4) is connected to ground.

Various changes in form and details may be made to the examples above without departing from the spirit and scope of the claims and their equivalents. The examples are for the sake of description only, and not for purposes of limitation. Descriptions of features in each example are to be considered as being applicable to similar features or aspects in other examples. Suitable results may be achieved if sequences are performed in a different order, and/or if components in a described system, architecture, device, or circuit are combined differently, and/or replaced or supplemented by other components or their equivalents. The scope of the disclosure is not defined by the detailed description, but by the claims and their equivalents. All variations within the scope of the claims and their equivalents are included in the disclosure.

The invention claimed is:

1. A detector that applies voltage to a first electrode that detects when a human body approaches or contacts an operation surface and a second electrode that is arranged facing the first electrode to detect a user operation performed on the operation surface based on a change in capacitance of the first electrode to which the voltage has been applied, the detector comprising:
   a processor that obtains a value of a detection signal corresponding to the capacitance of the first electrode; and
   a switch that forcibly switches the second electrode to a state connected to ground so that the second electrode shifts to ground potential after the voltage is applied to the first electrode and the second electrode,
   wherein the processor determines whether wire breakage is occurring in the first electrode and whether wire breakage is occurring in the second electrode based on the value of the detection signal obtained from the first electrode after the second electrode is connected to ground and a difference in the detection signal obtained from the first electrode before and after the second electrode is connected to ground.

2. The detector according to claim 1, further comprising:
   a buffer that sets a potential at the second electrode to be same as that at the first electrode when applying the voltage to the first electrode.

3. The detector according to claim 2, wherein the switch connects to ground a branching wire branched from a connection wire connecting the second electrode and the buffer to forcibly shift the second electrode to the ground potential.

4. The detector according to claim 1,
wherein the processor repeats an operation determination process that applies the voltage to the first electrode and monitors the change in the capacitance of the first electrode to detect the user operation performed on the operation surface, and
   a wire breakage detection process, which includes forcibly shifting the second electrode to the ground potential and determining whether the wire breakage has occurred in the first electrode and whether the wire breakage has occurred in the second electrode, is set independently from the operation determination process.

5. The detector according to claim 4, wherein a processing time of at least one of the operation determination process and the wire breakage detection process is shorter than a time required for the capacitance to change in order to detect the user operation.

6. The detector according to claim 4, wherein a set of the wire breakage detection process and the operation determination process is repeated in cycles.

7. A detector that detects a user operation performed on an operation surface, the detector comprising:
   a first electrode that detects when a human body approaches or contacts the operation surface;
   a second electrode that is arranged facing the first electrode;
   one or more processors; and
   a non-transitory memory storing instructions executable by the one or more processors,
   wherein, when executed by the one or more processors, the instructions cause the processor to:
      obtain a value of a detection signal corresponding to a capacitance of the first electrode; and
      perform an operation determination process and a wire breakage detection process, the operation determination process includes:
      repeatedly applying voltage to the first electrode and the second electrode; and
      monitoring a change in the capacitance of the first electrode to detect a user operation performed on the operation surface, and
   the wire breakage detection process includes:
      forcibly switching the second electrode to a state connected to ground so that the second electrode shifts to ground potential after the voltage is applied to the first electrode and the second electrode; and
      determining whether wire breakage is occurring in the first electrode and whether wire breakage is occurring in the second electrode based on the value of the detection signal obtained from the first electrode after the second electrode is connected to ground and a difference in the detection signal obtained from the first electrode before and after the second electrode is connected to ground.

* * * * *